(12) United States Patent  
Drewery

(10) Patent No.: US 6,620,736 B2  
(45) Date of Patent: Sep. 16, 2003

(54) ELECTROSTATIC CONTROL OF DEPOSITION OF, AND ETCHING BY, IONIZED MATERIALS IN SEMICONDUCTOR PROCESSING

(75) Inventor: John Drewery, Alameda, CA (US)

(73) Assignee: Tokyo Electron Limited, Tokyo (JP)

(*) Notice: Subject to any disclaimer, the term of this patent is extended or adjusted under 35 U.S.C. 154(b) by 60 days.

(21) Appl. No.: 09/911,678

(22) Filed: Jul. 24, 2001

(65) Prior Publication Data

US 2003/0019582 A1 Jan. 30, 2003

(51) Int. Cl.[7] .......................... H01L 21/00; H05H 1/02; H05H 1/00; C23C 16/00
(52) U.S. Cl. ...................... 438/710; 438/716; 438/714; 427/569; 118/728; 118/720; 156/345.51; 156/345.3
(58) Field of Search .................. 156/345.51, 345.3; 118/728, 715, 729, 730, 724, 720; 427/569; 438/710, 712, 716, 714

(56) References Cited

U.S. PATENT DOCUMENTS

| | | | | |
|---|---|---|---|---|
| 4,962,727 A | * | 10/1990 | Harada | 118/723 R |
| 5,556,500 A | * | 9/1996 | Hasegawa et al. | 156/345.27 |
| 5,942,042 A | * | 8/1999 | Gogh | 118/728 |
| 6,074,518 A | * | 6/2000 | Imafuku et al. | 156/345.46 |
| 6,080,287 A | * | 6/2000 | Drewery et al. | 204/192.15 |
| 6,287,435 B1 | * | 9/2001 | Drewery et al. | 204/298.09 |
| 6,464,794 B1 | * | 10/2002 | Park et al. | 118/728 |

* cited by examiner

Primary Examiner—P. Hassanzadeh
(74) Attorney, Agent, or Firm—Wood, Herron & Evans, L.L.P.

(57) ABSTRACT

Deposition of ionized material at a beveled or non-flat edge of a semiconductor wafer and the etching by the ionized material at such edge is controlled in a high density plasma processing machine by surrounding the wafer with a conducting ring to affect sheath potential and deflecting the ions of the material in such a way that the deposition and etching rate changes in a controlled way over the region immediately adjacent the wafer edge. The ring may be biased in several ways to control the ion flux to the wafer edge.

13 Claims, 3 Drawing Sheets

ELECTROSTATIC CONTROL OF DEPOSITION OF, AND ETCHING BY, IONIZED MATERIALS IN SEMICONDUCTOR PROCESSING

This invention relates to the semiconductor wafer plasma processing, particularly to plasma deposition and etching processes, in which regions at the edge of the wafer are susceptible to contamination by ionized material from the processing space.

BACKGROUND OF THE INVENTION

In the deposition of material layers onto semiconductor wafers, it is necessary to control coverage of the edge region of the wafer, particularly on the so-called "bevel" where the wafer is no longer flat. This has become increasingly important with the introduction of the use of copper as an interconnect material. Copper, as a contaminant in silicon, prevents the functioning of devices such as transistors that are produced on the wafer. Areas of a semiconductor wafer inward of the beveled edge of the wafer are coated during processing with an oxide layer or a barrier material before copper is applied. The edge of the wafer, however, is either not coated with the oxide or barrier material or such coating is not well controlled. As a result, the coating of such areas in the region of the wafer edge must be carefully avoided if contamination of the silicon and resulting damage to devices being made on the wafer is to be prevented. These areas on which copper deposition is to be avoided include the edge around the front side of the wafer as well as the wafer perimeter and the entire backside surface of the wafer. These areas are also areas at which the wafer is subject to handling. Therefore, with copper and other deposited materials, it is preferred that deposited material thickness around the bevel tapers to zero in a controlled way.

One method of controlling edge deposition has been through the use of shadow masks, that is, masks that do not contact the wafer, to shield the edge of the wafer from deposition. Another method has been through the use of clamps or clamping rings, which do contact the wafer, to shield the edge from deposition. Each of these methods has disadvantages. For example, deposition on the mask or clamp leads to particle problems from loosely adhered material. Also, as a significant amount of material is deposited on the shadow ring or clamp, the size of the clamp changes, which affects the size of the region which the clamp or mask shields.

Currently used deposition systems often include wafer supports such as electrostatic chucks that do not overlap the wafer bevel. In the cases of these non-overlapping supports, bevel area deposition is more difficult to control.

Further, in a high density plasma etching apparatus, the etch rate at the bevel must be controlled to prevent over etching. In this case, it is desirable to steer ions that are causing the etching away from the bevel, thereby reducing the etch rate there. In some cases, it may be desirable to increase etch rate locally by steering the ions toward the bevel.

Accordingly, the need exists for the control of ions at the edge region of a wafer during ionized deposition and etching.

SUMMARY OF THE INVENTION

A primary objective of the present invention is to control the deposition of coating material at the edge region of a semiconductor wafer, particularly in cases where a large fraction of the incident material is ionized, such as in Ionized Physical Vapor Deposition systems (iPVD).

The present invention is based in part on the principle that ions approaching the edge regions of a semiconductor are subjected to electrostatic deflection in the presence of an electric field. In accordance with principles of the present invention, the electric field at the edge region of the wafer is tailored so as to control deposition at the edge bevel of the wafer.

The invention is particularly useful where ionized material emerges from a plasma and is deposited upon a semiconductor wafer. In cases where the wafer is biased so as to acquire a non-zero potential with respect to the bulk of the plasma, the potential accelerates the ions in a direction more aligned with the direction of the sheath field that forms between the plasma and the biased wafer.

In accordance with certain principles of the invention, the sheath field is adjusted to deflect ions away from the wafer bevel towards a region where they can be captured.

According to certain embodiments of the invention, a ring is provided outside the wafer and is biased with respect to the plasma to shape the field around the wafer edge. As a result, ions arriving at the sheath are deflected by the sheath field and then pass through a field-free region, thereafter intercepting the shield instead of the wafer bevel.

In one embodiment of the invention, a metallic ring is provided that is in contact with the surface of an electrostatic chuck on which the wafer is held. The chuck is biased and a similar bias appears on the ring. A protrusion is provided on the ring to enhance the field locally, which leads to a local curvature of the sheath surface, so that an ion that would have intercepted the wafer bevel will instead be deflected. The ring has a profile that controls the probability that the ion will be collected by the shield rather than arriving at the wafer. The details of this profile may be based on gas pressure and the sticking coefficient of the ion on the ring and on the chuck as a function of ion energy, charge state, and incident angle, and as a function of the desired deposition profile on the wafer bevel.

In another embodiment of the invention, a ring is provided that is grounded while the chuck is biased, or that is biased to a different level than is the wafer. The ring may, for example, be biased to a level such that the average potential difference between the bulk of the plasma and the ring has a lower magnitude than the average difference between the wafer DC bias potential and the bulk plasma potential. In this case, a sheath will still exist over the ring although its thickness may be reduced. In this case, no field free region, as mentioned above, will exist. Material may, however, tend to be attracted towards the wafer and chuck, which would be preferred where such coating is desirable. Alternatively, the ring may be biased separately from the wafer so that the average difference between the potential of the ring and that of the bulk plasma is higher than the average difference between the potential of the wafer and that of the bulk plasma. This allows ions to be scavenged from the edge region of the wafer, and ions penetrating between the shield and the wafer to be attracted towards the shield, with the result of reducing deposition on the bevel.

The principles employed in the above described embodiments may also be applied to control the rate of etching at the edge region of a wafer. Etching is generally greatest where there is the largest arrival rate of ionized material. A reduction of the bevel etch rate can be achieved by providing deflection of ions away from the edge of the wafer.

Multiple rings may be combined that are not in mutual electrical contact. Such rings may be maintained at different potentials and have different other properties. For example, an outer shield may be grounded and textured to improve adhesion of deposited material. Where wafer bias is relatively large, resputtering of deposited material from the wafer occurs, but a grounded outer shield limits or eliminates resputtering from the outer shield. Alternatively, the outer shield may be separately biased to affect the plasma parameters in desirable ways, or it may be formed of a different material such as a dielectric material.

Electrical continuity from the chuck to the ring can be achieved by a direct DC connection, or by capacitance between the chuck body and the ring.

In the case of deposition, the ring is preferably designed so that, as material collects upon it, its profile performs within specification from immediately after installation up to the time it is removed for cleaning or replacement.

These and other objectives and advantages of the present invention will be more readily apparent from the following detailed description.

DETAILED DESCRIPTION

Figure 1:
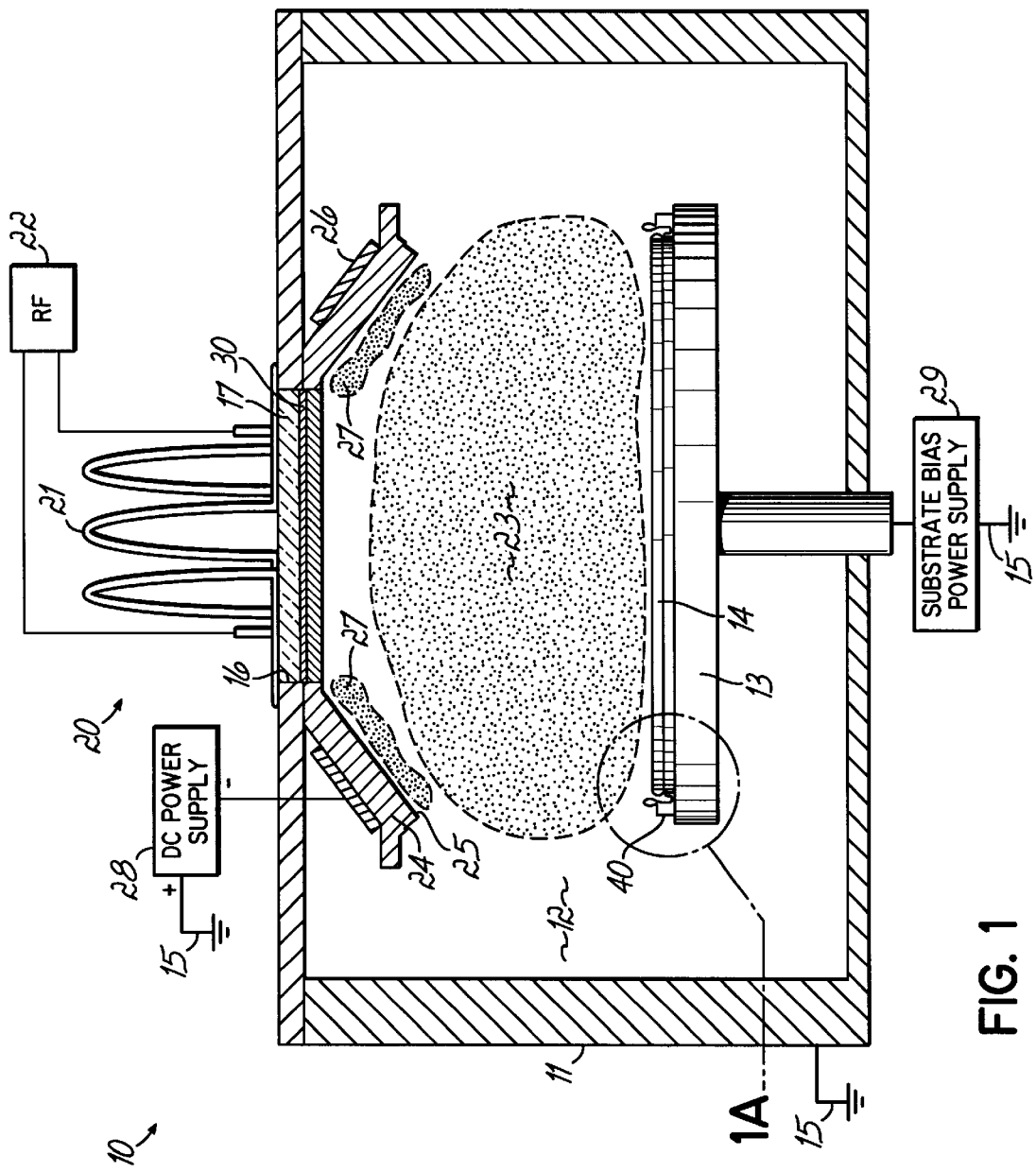
FIG. 1 is a diagrammatic view of an iPVD reactor.

FIG. 1 illustrates a semiconductor wafer processing apparatus 10, which may be an iPVD apparatus of a type such as described in U.S. Pat. No. 6,080,287 and U.S. Pat. No. 6,287,435, both hereby expressly incorporated herein by reference. The apparatus 10 is diagrammatically illustrated as having a chamber wall 11 that encloses a vacuum chamber 12. A substrate support 13 is disposed within the chamber 12 for holding an upwardly facing semiconductor wafer or other substrate 14 for processing. The chamber wall 11 is formed of or lined with metal and is electrically connected to a system ground 15. In the top of the chamber wall 11 is an opening 16 that is covered by a dielectric window 17 which is sealed to the wall 11 to complete the vacuum tight enclosure of the chamber 12 to support a vacuum therein. Behind the window 17 outside of the chamber 12 is an RF source 20, which includes a coil or other antenna 21 connected across an RF power generator 22 which typically produces RF energy in the 1 to 13.56 MHz range. The antenna 21 is positioned and configured to couple RF energy into the chamber 12 to form a high density plasma 23 in the low pressure gas within the chamber 12.

An annular frusto-conical target 24 is located either entirely within the chamber 12 as shown or in the upper portion of the wall 11 surrounding the window 17 with a sputtering surface 25 thereof in communication with the inside of the vacuum chamber 12. A permanent magnet assembly 26 is positioned behind the target 24 and positioned to form a closed magnetic tunnel over the surface 25 of the target 24 to trap electrons and form a high energy sputtering plasma 27 over the surface 25 of the target 24 when energized with DC power from a power supply 28. A bias power source 29, typically an RF source, is also usually provided to create a negative DC bias on the wafer 14 that is held on the substrate support 13 to attract positive ions from the plasma 23 toward the substrate 14.

In a deposition apparatus 10 such as an iPVD reactor, material sputtered from the target 24 is ionized by the high density plasma 23 and attracted by bias on the substrate 14 toward the substrate 14. A deposition baffle 30 may be positioned inside of the window to prevent material from depositing on the window. Without the target 24, or when operating parameters are otherwise appropriately set, the apparatus 10 described above would function essentially as an etch reactor etching the substrate 14 with ions from the plasma 23.

In deposition processes and in etching processes, it may often be desirable to control deposition onto or removal of material from the edge region or bevel of a wafer 14. Such an edge region is shown in the enlarged view of FIG. 1A, where the wafer 14 is illustrated supported on the substrate support 13 with its outer rim or edge 31 shown with a bevel 32 on its upper side. According to one embodiment of the invention, the substrate support 13 is configured with an upwardly extending substrate supporting surface 33 slightly smaller in diameter than the diameter of the wafer 14 so that the edge 31 of the wafer 14 slightly overhangs the surface 33. Surrounding the surface 33 of the support 13 is a ring 40 which extends outside the edge 31 of the wafer 14. The ring 40 is biased with respect to the plasma 23 and is used to shape the field, illustrated by equipotential lines 43, around the edge 31 of the wafer 14. The ring 40 in this embodiment is either formed of metallic material or is provided with an electrically conductive outer surface.

In cases such as iPVD or soft etching, where a large fraction of the incident material is ionized, the ions are subject to electrostatic deflection in the presence of an electric field. Exploiting this characteristic, the potential on the ring 40 is controlled in such a way as to tailor this field at the edge 31 of the wafer 14 so as to control deposition or ion flux onto and around the bevel 32. The wafer 14 is typically biased, that is, made to acquire a non-zero potential with respect to the bulk of the plasma 23, either by an external voltage applied by the bias generator 29 or by the bulk of the plasma 23, that is, either by an external voltage or by the universal process by which the sheath forms around an object in contact with a plasma 23. This potential accelerates the ions in a direction more aligned with the direction of the sheath field. This field is preferably adjusted to deflect ions away from the wafer bevel 32 towards a region where they can be captured, such as is illustrated by the arrow 44 representing the path of an ion 45 in FIG. 1A.

Figure 1A:
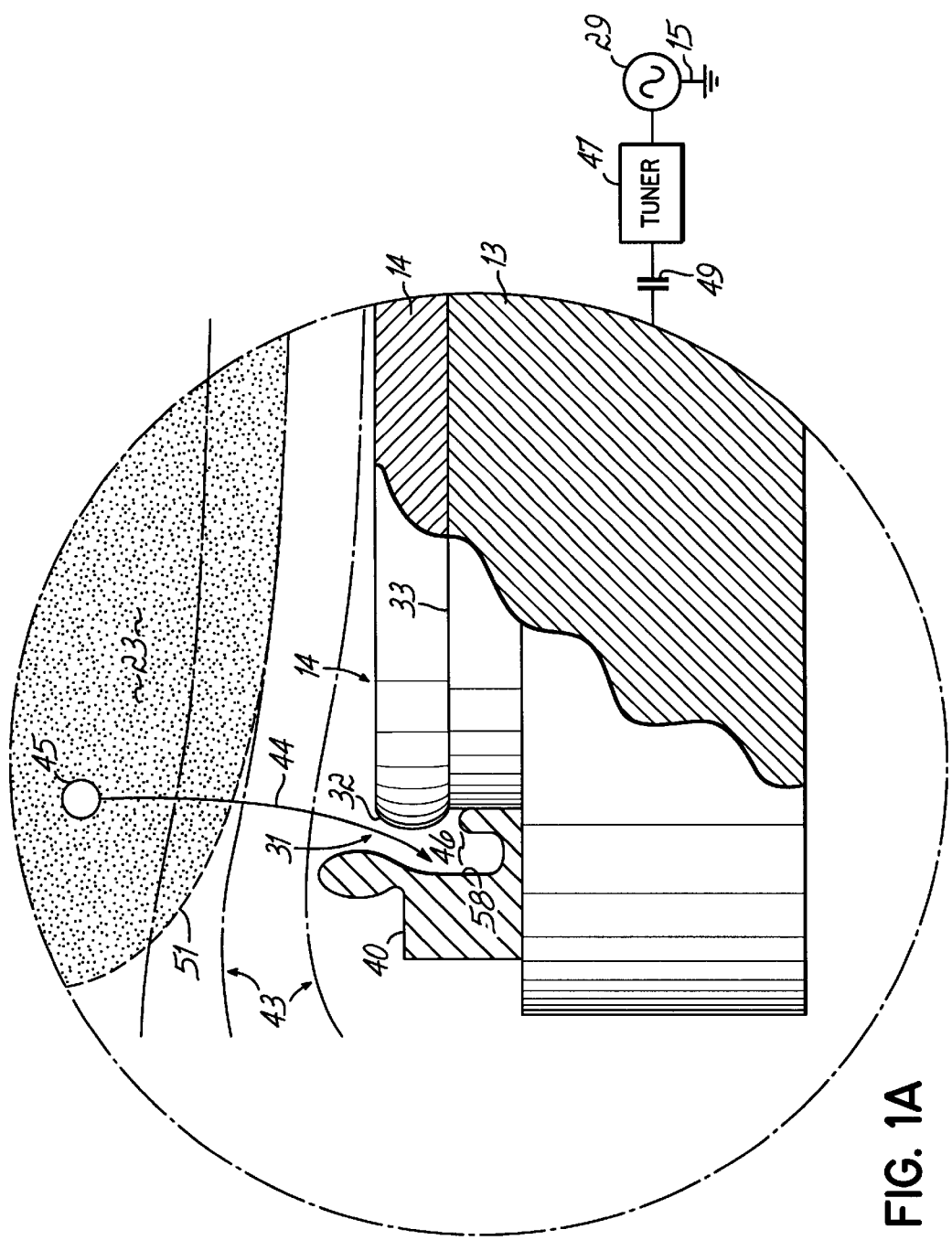
FIG. 1A is an enlargement of a portion of FIG. 1 illustrating one embodiment of the present invention.

The ring 40 in FIG. 1A is biased to reshape the sheath field 43 that borders the plasma 23, as shown by the shape of equipotential lines of the field 43. Ion 45 arriving at the sheath is deflected by the sheath field 43 and then passes along the arrow 44 through a field-free region 46 before intercepting the ring, instead of the wafer bevel 32. The configuration of the ring 40 is optimized for the desired redistribution of ions such as ion 45, preferably to collect the ions on the ring 40. In this embodiment, RF bias power is supplied to the substrate support or chuck 13 from the RF source 29 via tuner 47 and DC blocking capacitor 49. The chuck 13 consists preferably of a single metallic piece, preferably a high thermal conductivity material, with an overall dielectric coating. Many more complex chuck designs are known to those skilled in the art and the ideas set out in this disclosure can be extended to such constructions.

In a preferred embodiment, a metallic ring 40 is in direct electrical contact with the surface 33 of electrostatic chuck 13 which holds the wafer 14 in position on the surface 33. As part of a treatment process, the chuck 13 is biased by the RF power supply 29. A similar bias is made to appear on the ring 40 either by the direct DC connection between the ring 40 and the substrate support 13 or by capacitive coupling. As a result, an average DC bias appears on the wafer 14 and ring 40. The sheath edge of the plasma 23 is shown as a dotted line 51. A protrusion 52 is provided on the ring 40 to enhance the local effect of the ring 40 on the field 43, leading to a local curvature of the sheath surface 51. Ion 45 that would have intercepted the wafer bevel 32, instead is deflected and passes into the essentially field free region 46, whereupon it is subsequently intercepted by the surface 58 of the ring 40, in which case, the ion will lose its charge. Such ions may, however, be adsorbed or may be re-emitted, i.e., bounce off the surface 58. Alternatively, ions may be scattered by gas molecules with which they might collide along the path. The ring 40 has a profile that controls the probability that the ion 45 will be collected by the ring 40 rather than arriving at the wafer 14. The details of this profile may be selected on the basis of computer modeling of the transit of the ion 45. Factors taken into account include the gas pressure and the sticking coefficient of the ion on the ring and on the chuck (as a function of energy, charge state, and incident angle), and the desired deposition profile on the wafer bevel 32. In that the profile of the ring changes as material is deposited, ring configuration should be optimized to perform within specifications both at the start and end of its life.

In a certain embodiment, the ring 40 is either grounded while the chuck 13 is biased, or the ring 40 is biased to a level such that the average potential difference between the bulk of the plasma 23 and the ring 40 has a lower magnitude than the average difference between the wafer DC bias potential and the bulk plasma potential. In this case, a sheath will still exist over the ring 40 although its thickness may be reduced. The field free region 46, however, will not exist. Material will tend to be attracted towards the wafer 14 and the chuck 13. This embodiment would be preferred where such coating is desirable.

The ring 40 may be biased separately from the wafer 14 so that the average difference between its potential and that of the bulk plasma 23 is higher than the average difference between the wafer potential and that of the bulk plasma. This allows ions to be scavenged from the edge region 31 of the wafer 14 to the ring 40 to a somewhat greater extent than otherwise. Also ions penetrating between the shield or ring 40 and the wafer 14 will be attracted towards the ring 40. As a result, deposition on the bevel 32 is reduced compared with the case where the bias is equal to that on the wafer 14.

In the case where the apparatus 10 is configured to etch rather than to deposit material, etching is generally greatest where there is the largest arrival rate of ionized material. The above description for the deposition case applies similarly to the etch case. For example, referring to FIG. 1A, there would be a reduction of the etch rate on the bevel 32 due to deflection of the ions 45 away from the wafer 14.

Figure 2:
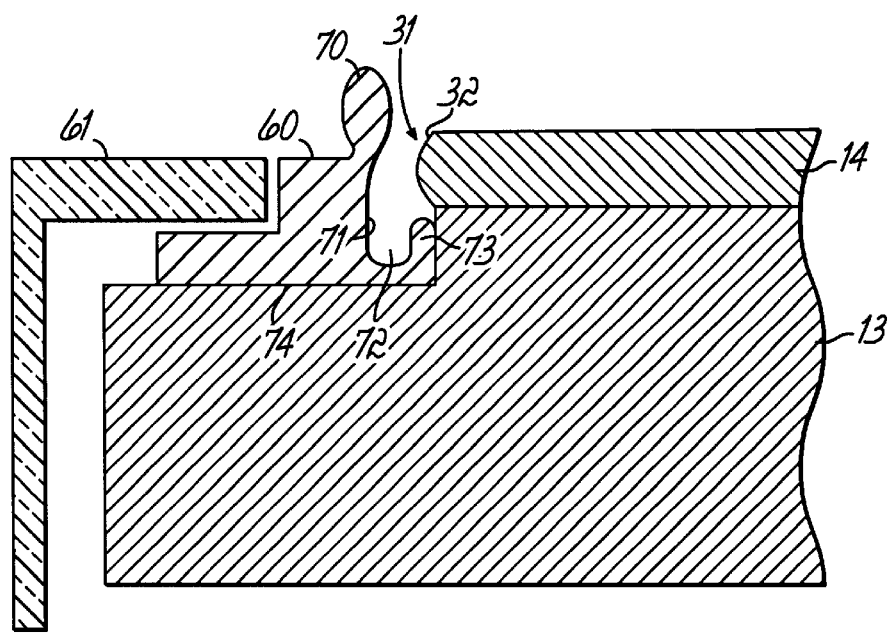
FIG. 2 is a view similar to FIG. 1A illustrating an alternative embodiment of the invention.

FIG. 2 illustrates an alternative arrangement in which an inner ring 60, similar to the ring 40 referred to above, is combined with an interlocking secondary shield 61, which is not in direct electrical contact with the ring 60. The ring 60 may be formed from a conductor or an insulator. In one preferred embodiment, the outer shield 61 is grounded and textured to improve adhesion of deposited material. In the case of deposition, where the wafer bias is relatively large, resputtering of the deposited material occurs. It is usually undesirable for the wafer surroundings to be resputtered. The presence of the grounded outer shield 61 limits or eliminates resputtering of material that is deposited on this outer shield. Alternatively, the outer shield 61 may be separately biased by an auxiliary power supply in order to affect the plasma parameters in desirable ways. In the etch case, the outer ring 61 would preferably be formed from a dielectric material such as quartz or alumina, or, in the case of reactive ion etching, from a material inert to the etch chemistry.

Figure 3:
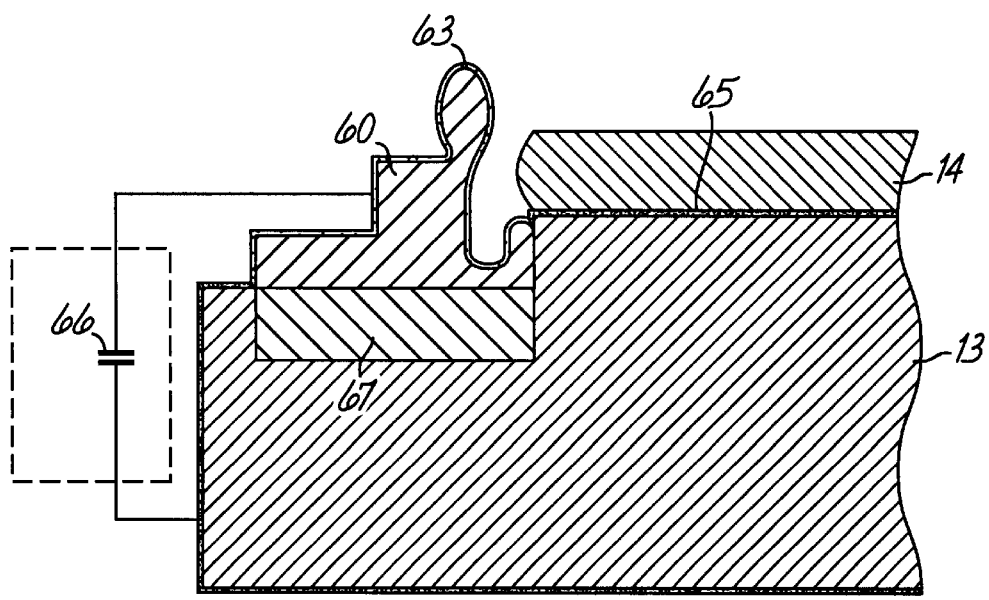
FIG. 3 is a view similar to FIGS. 1A and 2 illustrating another alternative embodiment of the invention.

Electrical continuity from the chuck 13 to the ring 60, and also to the ring 40, can be achieved by a direct DC connection, for example, by screwing down the ring 60 to the chuck 13 using an electrically conductive screw. Alternatively, as illustrated in FIG. 3, the capacitance between the chuck body 13 and the ring 60 may be relied upon to communicate a bias potential from the support or chuck 13 and the ring 60, in which case the ring 60 should have an electrically conductive outer region. Such a region may be in the form of a thin dielectric coating 63, preferably one having a high dielectric constant. RF power may be supplied to the ring 60 by coupling from the chuck 13. The chuck 13 may have a dielectric coating 65 thereon to prevent DC leakage from the chuck body 13.

The combination of one or both of dielectric layers 63, 65 form a capacitor 66 through which RF power enters the ring 60. A separate conducting ring 67 may be embedded in the chuck 13 and RF powered, through its own power supply or otherwise, if the body of the chuck 13 is non-conducting or if separate control of the bias of ring 60 is desirable.

Desirable features of the rings 40, 60 described above are described with reference to FIG. 2. For the case where ionized material is being deposited, the rings 40,60 include a field shaping protrusion 70 at the top and a surface 71 that is exposed to material arrival and which is textured or coated to promote adhesion. The rings 40,60 also have a high aspect ratio pocket 72 that captures arriving material and an inner lip 73 that protects the substrate support 13 from deposition. The rings 40,60 also have a bottom surface 74 that is flat and smooth to promote electrical coupling with the surface on which they are mounted.

For the case where etching is being carried out, the rings 40,60 have the field shaping protrusion 70 with its surface 71 that is exposed to ion arrival. The surface 71, rather than having properties to promote adhesion, is instead formed of a material that is compatible with reactive etch chemistry or has a coating that is resistant to sputtering or is composed of material that will not contaminate the wafer 14. The inner lip 73 is provided to protect the chuck 13 from etching byproducts and chemical reactants in the chamber. The bottom surface 74 is also smooth and flat to promote electrical coupling.

In the case of deposition, the rings 40,60 must be designed by taking into account the fact that the profile of the rings 40,60 will evolve with time as material collects upon them. This can be achieved by computational modeling of the evolution of the profile. The object is to produce a profile that performs within specifications from immediately after installation of the rings 40,60 up to the time they are removed for cleaning and/or replacement. The geometry of the rings 40,60 also takes into account the tolerances both in manufacturing and in the placement of the wafer 14 by a wafer loading device.

While the above description and accompanying drawings set forth various embodiments of the invention, it will be apparent to those skilled in the art that additions and modifications may be made without departing from the principles of the invention.

Accordingly, what is claimed is:

1. A method of controlling ionized materials onto the edge of a semiconductor wafer on a substrate support during processing of the wafer with a plasma in a processing apparatus, the method comprising:

providing to a substrate support of the plasma processing apparatus a ring on the wafer support that is in direct contact with the support and is configured to surround the edge of a semiconductor wafer when such wafer is supported on the support, the ring having an annular electrically conductive surface that protrudes away from the support, when provided thereon, beyond such wafer and toward the plasma, the ring being configured so as to shape the sheath field of the plasma around the perimeter of the wafer when an electrical potential on the conductive surface thereof is applied and maintained on said conductive surface that biases the conductive surface relative to the plasma so that ions from the plasma are deflected by the shaped sheath field in the region of the edge of the wafer and the ring, the ring having an annular lip configured and positioned to shield the edge of the wafer support from deflected ions and forming an annular pocket between the lip and the protruding electrically conductive surface.

2. The method of claim 1 further comprising:

supporting a semiconductor wafer on the support, the wafer having a perimeter located interiorly of the ring and spaced therefrom;

creating a plasma within the processing apparatus;

biasing the wafer; and applying an electrical potential to the conductive surface of the ring so as to shape the plasma sheath proximate the edge of the wafer and thereby deflecting ions from the plasma away from the edge of the wafer.

3. The method of claim 1 further comprising:

shaping the sheath of the plasma around the perimeter of the wafer by maintaining the electrical potential of the electrically conductive surface; and deflecting ions from the plasma with the shaped sheath of the plasma.

4. The method of claim 1 wherein:

the ring has a collecting surface thereon adapted to promote adhesion thereto of ions incident thereon.

5. The method of claim 4, further comprising:

shaping the sheath of the plasma around the perimeter of the wafer by maintaining the electrical potential of the electrically conductive surface;

deflecting ions from the plasma with the shaped sheath and onto the collecting surface with the shaped sheath of the plasma.

6. The method of claim 1 wherein:

the ring has a high aspect ratio pocket formed therein configured to capture arriving material.

7. The method of claim 6, further comprising:

shaping the sheath of the plasma around the perimeter of the wafer by maintaining the electrical potential of the electrically conductive surface;

deflecting ions from the plasma by the shaped sheath; and capturing deflected ions from the plasma in the high aspect ratio pocket.

8. The method of claim 1 wherein:

the ring has an ion receiving surface thereon composed of material that is compatible with the chemistry of an etch process to be performed in the apparatus so as to not contaminate the wafer during etching.

9. The method of claim 8, further comprising:

shaping the sheath of the plasma around the perimeter of the wafer by maintaining the electrical potential of the electrically conductive surface; and deflecting ions from the plasma with the shaped sheath and onto the receiving surface.

10. The method of claim 1 further comprising:

coupling electrical potential onto the electrically conductive surface of the ring by making direct electrical connection with the substrate support.

11. The method of claim 1 further comprising:

capacitively coupling electrical potential onto the electrically conductive surface of the ring from the substrate support.

12. The method of claim 1 further comprising:

coupling electrical potential onto the electrically conductive surface of the ring from a power supply.

13. The method of claim 1 further comprising:

providing a secondary ring configured to surround the ring provided to the substrate support; and maintaining the secondary ring at an electrical potential different from the potential of said conductive surface of the ring.

* * * * *